United States Patent
Lai et al.

(10) Patent No.: US 11,492,718 B1
(45) Date of Patent: Nov. 8, 2022

(54) ELECTRODEPOSITED COPPER FOIL AND COPPER CLAD LAMINATE

(71) Applicant: CHANG CHUN PETROCHEMICAL CO., LTD., Taipei (TW)

(72) Inventors: Yao-Sheng Lai, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 17/583,236

(22) Filed: Jan. 25, 2022

(30) Foreign Application Priority Data

Jun. 16, 2021 (TW) ................................ 110121944

(51) Int. Cl.
| | | |
|---|---|---|
| C25D 7/04 | (2006.01) | |
| C25D 1/04 | (2006.01) | |
| H05K 3/14 | (2006.01) | |
| C25D 5/00 | (2006.01) | |
| C25D 5/12 | (2006.01) | |
| C25D 7/06 | (2006.01) | |
| B32B 15/01 | (2006.01) | |
| B32B 15/08 | (2006.01) | |

(52) U.S. Cl.
CPC ............. *C25D 1/04* (2013.01); *B32B 15/01* (2013.01); *B32B 15/08* (2013.01); *C25D 5/12* (2013.01); *C25D 5/605* (2020.08); *C25D 7/0614* (2013.01); *H05K 3/14* (2013.01); *B32B 2307/30* (2013.01); *B32B 2457/08* (2013.01); *H05K 2203/0726* (2013.01); *Y10T 428/12431* (2015.01)

(58) Field of Classification Search
None
See application file for complete search history.

(56) References Cited

U.S. PATENT DOCUMENTS

| | | | |
|---|---|---|---|
| 6,544,663 B1* | 4/2003 | Nakano | C25D 3/38 |
| | | | 428/458 |
| 10,925,171 B2 | 2/2021 | Ori | |
| 2003/0116241 A1* | 6/2003 | Tomonaga | C25D 1/04 |
| | | | 148/670 |
| 2016/0212846 A1* | 7/2016 | Kohiki | H05K 3/205 |
| 2020/0265969 A1* | 8/2020 | Lee | C23C 18/2086 |
| 2021/0135233 A1* | 5/2021 | Lai | C25D 3/38 |

FOREIGN PATENT DOCUMENTS

| | | |
|---|---|---|
| JP | 2021-70872 A | 5/2021 |
| KR | 10-2018-0111672 A | 10/2018 |
| KR | 10-2021-0016440 A | 2/2021 |
| KR | 10-2021-0016455 A | 2/2021 |
| TW | 202117085 A | 5/2021 |

OTHER PUBLICATIONS

Wan et al., Corrosion Behavior of Copper at Elevated Temperature, Sep. 2012, Int. J. Electrochem. Sci., vol. 7, pp. 7902-7914 (Year: 2012).*

* cited by examiner

*Primary Examiner* — Seth Dumbris
(74) *Attorney, Agent, or Firm* — Winston Hsu

(57) ABSTRACT

An electrodeposited copper foil includes a bulk copper foil. When a weight of the electrodeposited copper foil is increased to 105.0 wt % during a thermogravimetric analysis (TGA) performed on the electrodeposited copper foil at a heating rate of 5° C./min and an air flow rate of 95 mL/min, a heating temperature of the TGA is defined as $T_{105.0\ wt\ \%}$ and in a range of 550° C. to 750° C.

13 Claims, 3 Drawing Sheets

ELECTRODEPOSITED COPPER FOIL AND COPPER CLAD LAMINATE

BACKGROUND OF THE INVENTION

1. Field of the Invention

The present disclosure relates to the field of copper foil, in particular to an electrodeposited copper foil and a copper-clad laminate thereof.

2. Description of the Prior Art

With increasing demand for small-sized and thin electronic products capable of transmitting high-frequency signals, the demand for printed circuit boards (PCBs) having conductive lines with miniature lines/spaces (L/S) and having flat contact surfaces between conductive lines and boards is also increasing. Generally speaking, the printed circuit board is a laminated structure including alternately stacked boards, conductive lines and adhesive materials, which may be fabricated by processing a copper foil and a copper-clad laminate. Specifically, the conductive lines may be copper conductive lines, and the adhesive materials may be polymer adhesive materials. The copper conductive lines may be disposed on the surfaces of the boards, and the polymer adhesive materials may be disposed between the adjacent boards to make the boards adhere to each other.

In order to increase the bonding strength between the adjacent boards and the thermal stability of the copper conductive lines, the copper conductive lines disposed on the surfaces of the boards may be blackened before the adjacent boards are adhered to each other, by which a fuzzy layer is generated on the surfaces of the copper conductive lines. In the subsequent laminating process, the polymer adhesive material may be embedded into the pores of the fuzzy layer to thereby improve the bonding strength between the adjacent boards.

Even though the aforementioned blackening treatment may indeed improve the bonding strength between the adjacent boards, the surface of the copper conductive lines may be blackened incompletely due to different shapes and characteristics of the copper conductive lines, which reduces the reliability of the printed circuit boards.

Therefore, there is still a need to provide an electrodeposited copper foil and a copper-clad laminate to solve the drawbacks in the prior art.

SUMMARY OF THE INVENTION

In view of the above, the present disclosure provides an improved electrodeposited copper foil and copper-clad laminate, which solves the drawbacks existing in the prior art.

According to one embodiment of the present disclosure, an electrodeposited copper foil is provided. The electrodeposited copper foil includes a bulk copper foil, and when a weight of the electrodeposited copper foil is increased to 105.0 wt % during a thermogravimetric analysis (TGA) performed on the electrodeposited copper foil at a heating rate of 5° C./min and an air flow rate of 95 mL/min, a heating temperature of the TGA is defined as $T_{105.0 \ wt \ \%}$ and in a range of 550° C. to 750° C.

Optionally, according to another embodiment of the present disclosure, an electrodeposited copper foil is provided, which includes a first surface treatment layer containing nickel, where the product of a specific surface area ($\mu m^2/\mu m^2$) of the outer surface of the first surface treatment layer and a nickel content ($\mu g/dm^2$) of the first surface treatment layer is in a range of 10 $\mu g/dm^2$ to 100 $\mu g/dm^2$.

Optionally, according to still another embodiment of the present disclosure, an electrodeposited copper foil is provided, which includes a first surface treatment layer and a second surface treatment layer. The first surface treatment layer is disposed on a first side of the electrodeposited copper foil, and the second surface treatment layer is disposed on a second side of the electrodeposited copper foil opposite to the first side of the electrodeposited copper foil. In particular, the first surface treatment layer and the second surface treatment layer each includes at least one sub-layer respectively, and the at least one sub-layer is selected from the group consisting of a barrier layer and an antirust layer.

According to still another embodiment of the present disclosure, a cooper-clad laminate is provided, which includes a board and one of the aforementioned electrodeposited copper foil, where the electrodeposited copper foil is disposed on the board.

According to the embodiments of the present disclosure, by controlling the characteristic temperature (such as $T_{105.0 \ wt \ \%}$) of the electrodeposited copper foil in a specific range, the blackened degree of the surface of the copper conductive lines may be improved effectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The disclosure will be better understood from the following description of exemplary embodiments together with reference to the accompanying drawings. The specific embodiments of the present disclosure and their working principle would be elaborated in detail by referring to the specific embodiments and the corresponding drawings of the present disclosure. In addition, the features in the drawings may not be drawn to scale for the sake of clarity, therefore the size of some of the features in the drawings may be deliberately enlarged or reduced.

DETAILED DESCRIPTION

Figure 1:
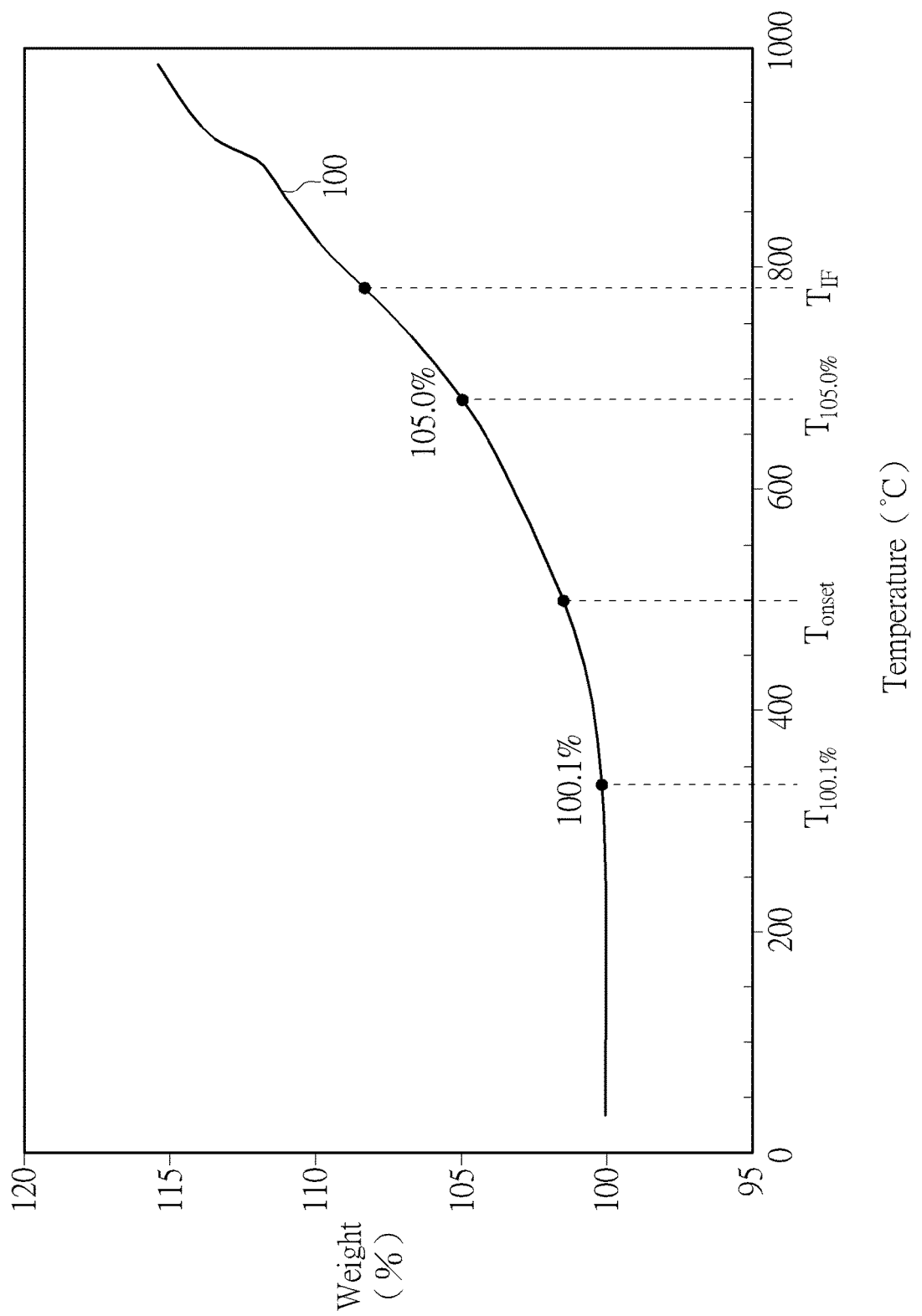
FIG. 1 is a schematic thermogravimetric analysis diagram of an electrodeposited copper foil according to one embodiment of the present disclosure.

To provide a better understanding of the present disclosure to those of ordinary skill in the art, several exemplary embodiments of the present disclosure regarding electrodeposited copper foils and copper clad laminates will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but may also include the meaning it is "above" or "over" something with no intermediate feature or layer therebetween (i.e., directly on something).

Although this disclosure uses the first, second, third, etc. terms to describe various elements, components, regions, layers, and/or blocks, it should be understood that these elements, components, regions, layers, and/or blocks should not be limited by these terms. These words are only used to distinguish one element, part, region, layer and/or block from another, and they do not imply and represent any previous ordinal number of the element, nor the arrangement order of one element and another, or the order of manufacturing methods. Therefore, the first element, component, region, layer or block discussed below may also be referred to as the second element, component, region, layer or block without departing from the scope of embodiments of the present disclosure.

At the very least, each numerical parameter should at least be construed in light of the number of reported significant digits and by applying ordinary rounding techniques. Ranges may be expressed herein as from one endpoint to another endpoint or between two endpoints. All ranges disclosed herein are inclusive of the endpoints, unless specified otherwise.

It should be noted that the technical features in different embodiments described in the following may be replaced, recombined, or mixed with one another to constitute another embodiment without departing from the spirit and the scope of the present disclosure.

The electrodeposited copper foil disclosed in the present disclosure includes a bulk copper foil. The copper content of the electrodeposited copper foil is larger than or equal to 99%, and the thickness of the electrodeposited copper foil is generally larger than or equal to 6 μm, for examples, in a range of 7 to 250 μm, in a range of 9 to 210 μm, or in a range therebetween, such as 12 μm, 18 μm, 35 μm, 70 μm, 105 μm, 140 μm, 175 μm, 210 am. The bulk copper foil of the electrodeposited copper foil may be formed by an electrodeposition (or electrolysis, electrolytic deposition, electroplating), where the bulk copper foil may have a drum side and a deposited side opposite to the drum side.

Optionally, a surface treatment layer may be disposed on at least one of the drum side and the deposited side of the bulk copper foil. The surface treatment layer may be a single layer structure or a multi-layer stacked structure. For example, the surface treatment layer may be a multi-layer stacked structure including a plurality of sub-layers, and each of the surface treatment layers may be respectively disposed on the drum side and the deposited side of the bulk copper foil, but is not limited thereto. The sub-layers of each of the surface treatment layers may be selected from, but not limited to, the group consisting of a roughening layer, a barrier layer, an antirust layer and a coupling layer.

The electrodeposited copper foil of the present disclosure has an excellent characteristic temperature of the thermogravimetric analysis (TGA), such as a primary temperature ($T_{105.0\ wt\ \%}$) is in a range of 550° C. to 750° C. Throughout the experiments, as the primary temperature ($T_{105.0\ wt\ \%}$) is controlled in a specific range, the blackened degrees of the surfaces of the conductive lines are improved effectively. In addition, as a secondary temperature ($T_{100.1\ wt\ \%}$) reaches 300° C. and above, the surface of the electrodeposited copper foil has a better capability of anti-oxidation.

FIG. 1 is a schematic thermogravimetric analysis diagram of an electrodeposited copper foil according to one embodiment of the present disclosure. The aforementioned thermogravimetric analysis is performed on the aforementioned electrodeposited copper foil at a heating rate of 5° C./min and an air flow rate of 95 mL/min (the air is such as 21 vol % of oxygen and 79 vol % of nitrogen). As indicated by a curve 100, as the temperature of the electrodeposited copper foil gradually rises in the air atmosphere, the weight of the electrodeposited copper foil will gradually increase. When the weight reaches about 101 wt % or above, the degree of change in the weight of the electrodeposited copper foil is relatively high, but when the weight is below 101 wt %, the degree of change in the weight of the electrodeposited copper foil is relatively low. Without being limited to any theory, the above phenomenon may be attributed to the fact that when the electrodeposited copper foil is heated in the air, physical and/or chemical reactions, such as oxidation, take place from the outermost side of the electrodeposited copper foil, and thereby the surface of the electrodeposited copper foil will react first. However, for the electrodeposited copper foil having a surface treatment layer, since the surface treatment layer accounts for less than 1% of the total weight of the electrodeposited copper foil (in other words, the total weight of the surface treatment layer is far less than the total weight of the bulk copper foil), the total weight of the electrodeposited copper foil will not exceed 101 wt % despite the complete reaction of the surface treatment layer. In contrast, when the total weight of the electrodeposited copper foil is increased to more than 101 wt %, it means that most of the surface treatment layer on the outside of the electrodeposited copper foil has been oxidized, and the oxidation reaction gradually takes place in the deeper portion of the bulk copper foil. As a result, the degree of change in the weight of the electrodeposited copper foil becomes more and more obvious.

Based on the above reasons, when the total weight of the electrodeposited copper foil increases to 105.0 wt %, the corresponding weight is already in the section of the curve where the degree of change in the weight of the electrodeposited copper foil is relatively high, so the corresponding temperature $T_{105.0\ wt\ \%}$ is defined as the primary temperature; for the same reason, when the total weight of the electrodeposited copper foil increases to 100.1 wt %, it means that the surface of the electrodeposited copper foil (for example, surface treatment layer) has started to oxidize, but the bulk copper foil has not started to oxidize, so the corresponding weight is in the section of the curve where the degree of change in the weight of the electrodeposited copper foil is relatively low, so the corresponding temperature $T_{100.1\ wt\ \%}$ is defined as the secondary temperature.

When the weight of the electrodeposited copper foil of the present disclosure reaches 105.0 wt % during the thermogravimetric analysis, the primary temperature ($T_{105.0\ wt\ \%}$) is in a range of 550° C. to 750° C., or in a range of 600° C. to 750° C., or equal to 682.36° C. as illustrated in FIG. 1. When the temperature is in the range of the primary temperature ($T_{105.0\ wt\ \%}$), the surface of the bulk copper foil is more likely to be blackened, and the phenomena of incomplete blackening is less likely to occur. It is speculated that the surface treatment layer is removed in the process of processing the electrodeposited copper foil to a circuit, thereby causing the bulk copper foil to be exposed to the air and thus likely to be oxidized locally. As a result, the phenomena of incomplete blackening would occur in the following process.

Without being limited to any theory, it is speculated that when the crystal size of the bulk copper foil is smaller and more uniform, and when the grains are arranged more closely, the heat tolerance and the anti-oxidation of the bulk copper foil are better. There are many ways to control the crystallization of the bulk copper foil, such as controlling the grain size number of a cathode drum of an electrodeposition apparatus, adjusting the type or concentration of additives in an electrolyte during an electrodeposition process, or by other ways. In particular, when the grain size number of the cathode drum is larger, it means that there are more grains per unit area of the cathode drum. Thus, there are more nucleation sites for forming the bulk copper foil, and the fabricated bulk copper foil may have relatively small crystal grains. However, when the grain size number is too large, the crystallization of the fabricated bulk copper foil may be disordered, and its heat tolerance may be reduced instead. The additives would affect the deposition of the copper ion and then change the corresponding crystallization of the bulk copper foil. In addition, it is speculated that, during the electrodeposition process for forming the bulk copper foil, the additives in the electrolyte may also be incorporated into the bulk copper foil and exist between the grains of the bulk copper foil (for example, existing at grain boundaries), which may thus avoid or reduce the possibility that the small grains merge with adjacent grains to generate large grains during a heating process, and thus facilitate the increase in the heat tolerance of the bulk copper foil. The additive may be selected from, but not limited to, polyoxyethylene fatty acid ester, polyoxyethylene sorbitan fatty acid ester, fatty alkanolamide, sucrose fatty acid ester, polysorbate fatty acid ester, alkyl glycoside, or the mixture thereof.

The secondary temperature ($T_{100.1\ wt\ \%}$) may be regarded as the temperature at which the metal on the surface of the electrodeposited copper foil begins to oxidize. Optionally, when the weight of the electrodeposited copper foil reaches 100.1 wt %, the secondary temperature ($T_{100.1\ wt\ \%}$) may be in a range of 300° C. to 400° C., or in a range of 330° C. to 400° C. Without being limited to any theory, the above phenomenon may be attributed to the fact that when the electrodeposited copper foil is heated in the air, physical/chemical reactions take place from the outermost side of the electrodeposited copper foil. For the electrodeposited copper foil having a surface treatment layer, when the weight of the electrodeposited copper foil starts to increase, the above secondary temperature may be attributed to the start of the oxidation of metal in the surface treatment layer (for example, the outside metal of the surface treatment layer).

In some embodiments, the secondary temperature ($T_{100.1\ wt\ \%}$) of the electrodeposited copper foil may be controlled by adding trace metals (such as zirconium, niobium, titanium and tantalum) as additives during the electrodeposition, but is not limited thereto. Without being limited by the specific theory, the trace metals may change the microstructure of the surface treatment layer, thereby changing the thermal properties thereof.

In addition to the primary temperature ($T_{105.0\ wt\ \%}$) and the secondary temperature ($T_{100.1\ wt\ \%}$), the built-in software in the thermogravimetric analyzer, such as TA universal analysis, may be used to further analyze other characteristic temperatures, such as onset temperature ($T_{onset}$) and inflection temperature ($T_{IF}$), for the sections of the curve with high degree of change in the weight of the electrodeposited copper foil during the above thermogravimetric analysis process. Because the sections of the curve with high degree of change in weight of the electrodeposited copper foil may be regarded as features representing the characteristics of the bulk copper foil, the onset temperature ($T_{onset}$) and the inflection temperature ($T_{IF}$) obtained by the analysis may also characterize the heat tolerance of the bulk copper foil.

The onset temperature ($T_{onset}$) corresponds to the temperature at which the weight of the electrodeposited copper foil starts to increase at a higher rate, and the onset temperature ($T_{onset}$) is a value obtained by selecting the primary temperature ($T_{105.0\ wt\ \%}$) as the starting point of analysis. Without being limited to a specific theory, it may be expected that the higher the onset temperature ($T_{onset}$), the better the anti-oxidation or heat tolerance of the bulk copper foil. As a result, the copper of the bulk copper foil is less likely to be oxidized into copper oxide (I) or copper oxide (II). For the electrodeposited copper foil of each embodiment of the present disclosure, the onset temperature ($T_{onset}$) is greater than the secondary temperature ($T_{100.1\ wt\ \%}$) and less than the primary temperature ($T_{105.0\ wt\ \%}$), for example, in a range of 400° C. to 600° C., or equal to 520.51° C. as illustrated in FIG. 1.

The inflection temperature ($T_{IF}$) corresponds to the temperature of inflection point at which the weight increase rate starts to slow down in the section of the curve where the degree of change in the weight of the electrodeposited copper foil is high. In other words, when the weight of the electrodeposited copper foil is greater than 105.0 wt %, the curve of the thermogravimetric analysis may show an inflection point. At this time, the specific heating temperature at the inflection point which is reached during the thermogravimetric analysis (or the temperature reached by the electrodeposited copper foil) may be defined as the inflection temperature ($T_{IF}$). When the temperature of Tw is higher, the anti-oxidation or the heat tolerance of the corresponding bulk copper foil of the electrodeposited copper foil is better. In particular, Tw may be in a range of 750° C. to 1000° C., where the ratio of the whole weight of electrodeposited copper foil in this stage to the original weight thereof is about in a range of 107.5 wt % to 110.0 wt %. Without being limited to any specific theory, it is speculated that the change in the weight increase rate in this stage may be attributed to the fact that most of the copper of the electrodeposited copper foil has been oxidized to the copper oxide (I) when $T_{IF}$ is reached, so the increase in the weight of the electrodeposited copper foil after the heating temperature is beyond $T_{IF}$ is mainly due to the further oxidation of the copper oxide (I) to the copper oxide (II). Alternatively, the change in the weight increase rate in this stage may be attributed to the fact that the electrodeposited copper foil has been protected by the copper oxide (I) or the copper oxide (II) on the surface of the electrodeposited copper foil after Tw is reached, thereby causing the decrease in the internal oxidation rate of the bulk copper foil.

Figure 2:
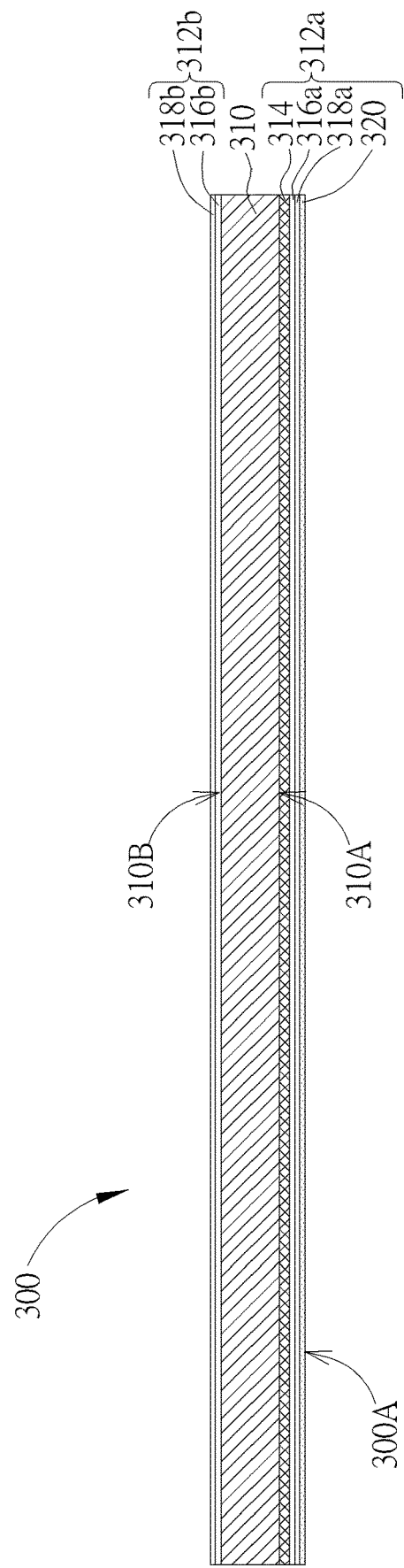
FIG. 2 is a schematic cross-sectional diagram of an electrodeposited copper foil according to one embodiment of the present disclosure.

For the aforementioned electrodeposited copper foil, the structure thereof is shown in FIG. 2 as an example. FIG. 2 is a schematic cross-sectional diagram of an electrodeposited copper foil according to some embodiments of the present disclosure. Referring to FIG. 2, an electrodeposited copper foil 300 includes a bulk copper foil 310, a first surface treatment layer 312a and a second surface treatment layer 312b. The bulk copper foil 310 has a first surface 310A and a second surface 310B opposite to the first surface 310A. According to one embodiment of the present disclosure, one of the first surface 310A and the second surface 310B of the bulk copper foil 310 may be a deposited side, and the other of the first surface 310A and the second surface 310B may be a drum side.

The first surface treatment layer 312a is disposed on the first surface 310A, and the second surface treatment layer 312b is disposed on the second surface 310B. The outer side of the first surface treatment layer 312a may be referred to a treating surface 300A of the electrodeposited copper foil 300, where the treating surface 300A is used for being laminated to a board. It is worth mentioning that the first surface treatment layer 312a and the second surface treatment layer 312b may be provided optionally, so that the structure is not limited to those described in the embodiments.

The first surface treatment layer 312a includes a plurality of stacked sub-layers, and each sub-layer may be selected from the group consisting of a roughening layer 314, a first barrier layer 316a, a first antirust layer 318a and a coupling layer 320. The second surface treatment layer 312b includes a plurality of stacked sub-layers, and each sub-layer may be selected from a group consisting of a second barrier layer 316b and a second antirust layer 318b. The compositions of the first barrier layer 316a and the second barrier layer 316b may be the same or different from each other, and the compositions of the first antirust layer 318a and the second antirust layer 318b may be the same or different from each other.

According to one embodiment of the present disclosure, since the total thickness of the first barrier layer 316a, the first antirust layer 318a and the coupling layer 320 of the first surface treatment layer 312a is much smaller than the thickness of the roughening layer 314, the surface morphology of the treating surface 300A of the electrodeposited copper foil 300, such as a specific surface area ($\mu m^2/\mu m^2$), is mainly affected by the roughening layer 314. In particular, the specific surface area refers to the ratio of the actual area of the surface to the projected area of the surface. According to one embodiment of the present disclosure, the first surface treatment layer 312a contains nickel, and the product of the specific surface area ($\mu m^2/\mu m^2$) of the first surface treatment layer 312a and a nickel content ($\mu g/dm^2$) of the first surface treatment layer 312a is in a range of 10 $\mu g/dm^2$ to 100 $\mu g/dm^2$, such as in a range of 10 $\mu g/dm^2$ to 60 $\mu g/dm^2$.

The aforementioned roughening layer 314 includes nodules. The nodules may be used to improve the surface roughness of the bulk copper foil, and the nodules may be copper nodules or copper alloy nodules. In order to prevent the nodules from peeling off from the bulk copper foil, a covering layer may be further disposed on the roughening layer to cover the nodules. The specific surface area ($\mu m^2/\mu m^2$) of the electrodeposited copper foil 300 may be adjusted by adjusting the number and size of the nodules in the roughening layer. For example, for the nodules and the covering layer formed by an electrodeposition, the roughening morphology may be adjusted by adjusting the types and the concentration of the additives in the electrolyte solution and/or the current density, but is not limited thereto. The additives may be, but not limited to, metal-salt additives, such as zirconium sulfate, sodium niobate, titanium sulfate and sodium tantalate.

Barrier layers may be composed of the same or different compositions, such as metal layers or metal alloy layers. The metal layer may be selected from, but not limited to, nickel, zinc, chromium, cobalt, molybdenum, iron, tin, vanadium, tungsten and titanium. In addition, the metal layer and the metal alloy layer may have a single-layer or a multi-layer structure, such as a double-layer structure including a zinc-containing layer and a nickel-containing layer stacked on each other. According to one embodiment of the present disclosure, the first barrier layer 316a has the double-layer structure including the zinc-containing layer and the nickel-containing layer stacked on each other, and the second barrier layer 316b has the single-layer structure include the zinc-containing layer.

The antirust layer is a coating layer applied to metal and is used to protect the metal from deterioration caused by corrosion and the like. The antirust layer includes metal or organic compound. When the antirust layer includes metal, the metal may be chromium or chromium alloy, and the chromium alloy may further include one element selected from nickel, zinc, cobalt, molybdenum, vanadium and the combination thereof. When the antirust layer includes an organic compound, non-limiting examples of organic molecules that may be used to form the organic antirust layer include porphyrin group, benzotriazole, triazine trithiol and the combinations thereof. The porphyrin group includes porphyrin, porphyrinic macrocycle, expanded porphyrin, contracted porphyrin, linear porphyrin polymer, porphyrin sandwich coordination complex, porphyrin array, 5,10,15, 20-tetrakis(4-aminophenyl)-porphyrin-Zn(II) and combinations thereof. According to one embodiment of the present disclosure, both the first antirust layer 318a and the second antirust layer 318b contain chromium.

The coupling layer may be made of silane to improve the adhesion between the electrodeposited copper foil and other materials (such as a prepreg). The coupling layer may be selected from but not limited to tetraorganosilane, aminoethyl aminopropyltrimethoxysilane, 3-aminopropyltrimethoxysilane, 1-[3-(trimethoxysilyl)propyl]urea, 3-aminopropyltriethoxysilane, (3-epoxypropyl)trimethoxysilane, (3-chloropropyl)trimethoxysilane and dimethyl-di-siloxane N-octyltriethoxysilane, tris(2-methoxyethoxy)vinylsilane), trimethylchlorosilane, methyltrichlorosilane, silicon tetrachloride, tetraethoxysilane, phenyltrimethoxysilane, chlorotriethoxysilane, ethylene-trimethoxysilane, alkoxysilane with 1 to 20 carbon atoms, vinylalkoxy with 1 to 20 carbon atoms, (meth)acylsilane and the combinations thereof, but not limited thereto.

The aforementioned electrodeposited copper foil may be further processed to become a copper-clad laminate (CCL). The copper-clad laminate includes at least a board and an electrodeposited copper foil, and the electrodeposited copper foil is disposed on at least one surface of the board. In particular, the treating surface of the electrodeposited copper foil may be in direct contact with and facing the board.

Furthermore, the board may be made of bakelite board, polymer board or fiberglass board, but is not limited thereto. The polymer of the polymer board may be such as epoxy resin, phenolic resin, acrylic resin, formaldehyde resin, bismaleimide triazine resin (BT resin), polyether sulfone, cellulose thermoplastic, polycarbonate, polypropylene, polyurethane and polyimide resin. The aforementioned glass fiber board may be a prepreg formed by soaking glass fiber nonwoven fabric in the aforementioned polymer (e.g., epoxy resin).

The aforementioned copper-clad laminate may be further fabricated into a printed circuit board, and the steps may include patterning the electrodeposited copper foil to obtain conductive lines and then blackening the conductive lines. In particular, the blackening process is a treatment process using chemical bath and may include at least one pretreatment (for example, micro-etching or cleaning the surface of the conductive lines, etc.).

Methods for fabricating an electrodeposited copper foil and a copper-clad laminate are further described as examples. Each step in the fabricating method is described as follows:

(1) Step A

Step A is performed to form a bulk copper foil by an electrodeposition process. For example, an electrodeposition apparatus may be used to form the bulk copper foil (or referred to as a bare copper foil) by an electrodeposition process. Specifically, the electrodeposition apparatus includes at least a drum as a cathode, pairs of insoluble metal anode plates, and an inlet manifold for electrolyte solution. In particular, the drum is a rotatable metal drum, the surface thereof is a mirror polished surface. The metal anode plates may be separated from and fixedly disposed at the lower half of the metal cathode drum to surround the lower half of the metal cathode drum. The feeding manifold may be fixedly disposed under the metal cathode drum and between two metal anode plates.

During the electrodeposition process, the feeding manifold continuously supplies electrolyte solution between the drum and the metal anode plates. By applying current or voltage between the drum and the metal anode plates, copper may be electrodeposited on the drum to form the bulk copper foil. In addition, the continuous bulk copper foil may be manufactured by continuously rotating the drum and peeling the electrodeposited copper foil from one side of the drum. The surface of the bulk copper foil facing the drum may be referred to as a drum side, while the surface of the bulk copper foil away from the drum may be referred to as a deposited side.

For the bulk copper foil, the fabrication parameters are described as follows:

<1.1 Composition of Electrolyte Solution and Electrolysis Conditions>

Copper sulfate ($CuSO_4 \cdot 5H_2O$): 320 g/L
Sulfuric acid: 95 g/L
Chloride ion (from hydrochloric acid, manufactured by RCl Labsmay Ltd.): 30 mg/L (ppm)
Low molecular weight gel (DV, manufactured by Nippi, Inc.): 5.5 ppm
Additive (Polyoxyethylene (20) sorbitan monooleate, also Tween 80, manufactured by Acros): 10 ppm
Liquid temperature: 50° C.
Current density: 70 A/dm$^2$
Thickness of bulk copper foil: about 35 m <1.2 Cathode Drum>

Material: Titanium
Grain size number: 6 to 10

(2) Step B

In step B, a surface cleaning process is performed on the bulk copper foil to ensure that the surface of the bulk copper foil is free of contaminant (such as oil stains and oxides), the fabrication parameters are described as follows:

<2.1 Composition and Cleaning Conditions of Cleaning Solution>

Copper sulfate ($CuSO_4 \cdot 5H_2O$): 200 g/L
Sulfuric acid: 100 g/L
Liquid temperature: 25° C.
Soaking time: 5 seconds (3) Step C In step C, nodules are formed on one of the deposited side and the drum side of the aforementioned bulk copper foil. For example, the nodules may be formed on one of the deposited side and the drum side of the bulk copper foil by an electrodeposition process. In addition, in order to prevent the nodules from falling, a covering layer may be further formed on the nodules. The fabrication parameters of the nodules and the covering layer are described as follows:

<3.1 Parameters for Fabricating Nodules>

Copper sulfate ($CuSO_4 \cdot 5H_2O$): 150 g/L
Sulfuric acid: 100 g/L
Zirconium sulfate ($Zr(SO_4)_2$): 2 to 5 mg/L (ppm)
Liquid temperature: 25° C.
Current density: 40 A/dm$^2$
Processing time: 10 seconds <3.2 Parameters for Fabricating Covering Layer>

Copper sulfate ($CuSO_4 \cdot 5H_2O$): 220 g/L
Sulfuric acid: 100 g/L
Titanium sulfate ($Ti(SO_4)_2$): 2 to 5 mg/L (ppm)
Liquid temperature: 40° C.
Current density: 15 A/dm$^2$
Processing time: 10 seconds (4) Step D In step D, a barrier layer is formed on each side of the bulk copper foil. For example, by performing an electrodeposition process, a barrier layer with a double-layered stacked structure (e.g., nickel-containing layer/zinc-containing layer, but not limited thereto) is formed on the side of the bulk copper foil having the nodules and the covering layer, while a barrier layer with a single-layered structure (e.g., zinc-containing layer, but not limited thereto) is formed on the side of the bulk copper foil without the nodules and the covering layer. The fabrication parameters thereof are described as follows:

<4.1 Electrolyte Composition and Electrodeposition Conditions for Forming Nickel-Containing Layer>

Nickel sulfate ($NiSO_4 \cdot 7H_2O$): 180 g/L
Boric acid ($H_3BO_3$): 30 g/L
Liquid temperature: 20° C.
Current density: 0.2 A/dm$^2$
Processing time: 10 seconds <4.2 Electrolyte Composition and Electrodeposition Conditions for Forming Zinc-Containing Layer>

Zinc sulfate ($ZnSO_4 \cdot 7H_2O$): 9 g/L
Liquid temperature: 20° C.
Current density: 0.2 A/dm$^2$
Processing time: 10 seconds (5) Step E In step E, an antirust layer, such as a chromium-containing layer, is formed on the barrier layer on each side of the aforementioned bulk copper foil, and the fabrication parameters are described as follows:

<5.1 Electrolyte Composition and Electrodeposition Conditions for Forming Chromium-Containing Layer>

Chromium trioxide ($CrO_3$): 5 g/L
Liquid temperature: 30° C.
Current density: 5 A/dm$^2$
Processing time: 10 seconds (6) Step F In step F, a coupling layer is formed on the side of the bulk copper foil having the nodules, the covering layer, the barrier layer and the antirust layer. For example, after the completion of the aforementioned electrodeposition process, the bulk copper foil is cleaned by water, and the surface of the bulk copper foil is not subject to a drying process. Afterwards, an aqueous solution containing silane coupling agent is sprayed on the antirust layer on the side of the bulk copper foil having the nodules, and thereby the silane coupling agent is adsorbed on the surface of the antirust layer. Subsequently, the bulk copper foil may be dried in an oven. The fabrication parameters are described as follows:

<6.1 Parameters for Fabricating a Silane Coupling Agent>

Silane coupling agent: 3-glycidoxypropyltrimethoxysilane (KBM-403)

Concentration of the silane coupling agent in aqueous solution: 0.25 wt %

Spraying time: 10 seconds

In order to enable a person having ordinary skill in the art to implement the present disclosure, the specific examples regarding an electrodeposited copper foil and a copper-clad laminate are further elaborated below. It should be noted, however, that the following examples are for illustrative purposes only and should not be construed to limit the present disclosure. That is, the materials, the amounts and ratios of the materials, and the processing flow in the respective examples may be appropriately modified so long as these modifications are within the spirit and scope of the present disclosure as defined by the appended claims.

EXAMPLES

Examples 1-13

Examples 1-13 are electrodeposited copper foils, and the fabricating process includes steps A to F in the aforementioned fabricating methods. The fabrication parameters that differ from those of the aforementioned fabricating process are shown in TABLE 1. Specifically, the structures of the electrodeposited copper foils of Examples 1-4, 6-13 are shown in FIG. 2, where a nickel-containing layer, a zinc-containing layer, a chromium-containing layer and a coupling layer are sequentially formed on a roughening layer, and a zinc-containing layer and a chromium-containing layer are sequentially formed on the side of the bulk copper foil without the roughening layer. For Example 5, the electrodeposited copper foil is not provided with the roughening layer, and a nickel-containing layer, a zinc-containing layer, a chromium-containing layer and a coupling layer are sequentially formed on the deposited side of the bulk copper foil. Besides, in Example 5, a zinc-containing layer and a chromium-containing layer are sequentially formed on the drum side of the bulk copper foil. The thickness of the electrodeposited copper foil in Examples 1-13 is 35 μm.

Comparative Examples 1-3

The fabricating processes of Comparative Examples 1-3 correspond to steps A to F in the aforementioned fabricating process. The fabrication parameters that differ from those of the aforementioned fabricating process are shown in TABLE 1. Specifically, the structures of the electrodeposited copper foils of Comparative Examples 1-3 are shown in FIG. 2, where the nickel-containing layer, the zinc-containing layer, the chromium-containing layer and the coupling layer are sequentially formed on the roughening layer, and the zinc-containing layer and the chromium-containing layer are sequentially formed on the side of the bulk copper foil without the roughening layer.

TABLE 1

| | Bulk copper foil | | Roughening layer | | | Covering layer | | Nickel-containing layer |
|---|---|---|---|---|---|---|---|---|
| | Additive (ppm) | Grain size number (#) | Treating surface | [Zr] (ppm) | Current density (ASD) | [Ti] (ppm) | Current density (ASD) | Current density (ASD) |
| Ex. 1 | 10 | 7 | Deposited side | 2 | 25 | 5 | 10 | 0.3 |
| Ex. 2 | 20 | 7 | Deposited side | 2 | 40 | 5 | 10 | 0.3 |
| Ex. 3 | 30 | 7 | Deposited side | 5 | 25 | 5 | 10 | 0.5 |
| Ex. 4 | 10 | 9 | Deposited side | 5 | 40 | 5 | 10 | 0.5 |
| Ex. 5 | 10 | 9 | N.A | 0 | 0 | 0 | 0 | 0.5 |
| Ex. 6 | 20 | 9 | Deposited side | 2 | 25 | 2 | 5 | 0.6 |
| Ex. 7 | 30 | 9 | Deposited side | 2 | 40 | 2 | 10 | 0.3 |
| Ex. 8 | 30 | 9 | Drum side | 5 | 40 | 2 | 10 | 0.5 |
| Ex. 9 | 30 | 9 | Deposited side | 2 | 40 | 2 | 10 | 0.7 |
| Ex. 10 | 30 | 9 | Drum side | 5 | 40 | 2 | 10 | 0.7 |
| Ex. 11 | 10 | 9 | Deposited side | 6 | 40 | 7 | 10 | 0.5 |
| Ex. 12 | 20 | 6 | Deposited side | 2 | 25 | 2 | 5 | 0.1 |
| Ex. 13 | 10 | 7 | Deposited side | 0 | 25 | 0 | 10 | 0.3 |
| c.f. 1 | 5 | 7 | Deposited side | 2 | 25 | 5 | 10 | 0.3 |
| c.f. 2 | 20 | 10 | Deposited side | 2 | 50 | 5 | 20 | 0.3 |
| c.f. 3 | 40 | 9 | Deposited side | 2 | 25 | 2 | 5 | 0.9 |

The test results of the aforementioned Examples 1-13 and Comparative Examples 1-3, such as <Thermogravimetric analysis>, <Blackened degree>, <Nickel content at surface>, <Specific surface area>, <Reliability> and <Signal transmission loss> are further elaborated below. The results are shown in TABLE 2 and TABLE 3.

<Thermogravimetric analysis>

A sample of about 15 to 30 mg electrodeposited copper foil was loaded into a sample holder of a thermogravimetric analyzer (SDT 2960, TA Instruments) to heat from the room temperature to 1000° C. at a fixed heating rate, and the original data was plotted as weight (%) versus temperature (° C.). An automatic analysis software was used to analyze the thermogravimetric chart. When the user selected the function "Curve value at Y" and input a specific weight (e.g., 105.0 wt % and 100.1 wt %), the analysis software would provide the corresponding temperature on the curve (e.g., $T_{105.0\ wt\%}$ and $T_{100.1\ wt\%}$). After obtaining the actual values of primary temperature ($T_{105.0\ wt\%}$) and secondary temperature ($T_{100.1\ wt\%}$), then selecting the function "onset point", and defining the calculation interval to obtain the onset temperature by setting the lower limit weight to be 100.1% and the corresponding temperature to be $T_{100.1\ wt\%}$, setting the upper limit weight to be 105.0% and the corresponding temperature to be $T_{105.0\ wt\%}$. The characteristic temperatures of the thermogravimetric analysis curves, such as the primary temperature ($T_{105.0\ wt\%}$), the secondary temperature ($T_{100.1\ wt\%}$) and the onset temperature ($T_{onset}$), are shown in TABLE 2 and TABLE 3. The specific conditions for measurement are as follows:

Gas: Air (21 vol % oxygen, 79 vol % nitrogen)
Gas flow rate: 95 mL/min
Heating rate: 5° C./min
Analysis software: TA universal analysis <Blackened Degree>

Six commercially available resin sheets (S7439G, manufactured by SyTech Corp.), each having a thickness of 0.076 mm, were stacked together to form a resin sheet stacked layer, and the treating surface of the surface-treated copper foil having the roughening layer was arranged to face the resin sheet stacked layer. Then, the surface-treated copper foil and the resin sheet stacked layer were laminated to form a copper-clad laminate. The lamination conditions were as follows: temperature: 233° C., pressure: 580 psi, and pressing time: 100 minutes. Subsequently, the copper-clad laminate was cut down to be in the size of 75 mm×150 mm, and the exposed surface of the electrodeposited copper foil was cleaned with acetone, where the exposed surface was not covered by the resin sheet stacked layer.

Then, a dry film photoresist layer (FF-9030A, Chang Chun plastics. co) was laminated to the exposed surface of the electrodeposited copper foil by the thermal lamination in a dark room. The conditions for laminating the dry film photoresist layer are as follows: temperature: 65° C., pressure: 3.0 kg/cm², pressing time: 3 seconds. After the dry film photoresist layer was laminated to the electrodeposited copper foil, the copper-clad laminate was cooled at the room temperature for 15 minutes. Then, a 75 mm×150 mm photomask with a specific pattern was covered on the surface of the electrodeposited copper foil. Under the shield of the photomask, the dry film photoresist layer on the electrodeposited copper foil was exposed by using an exposure machine (EXM-1201F, ORC) under the vacuum pressure of 600-700 mm Hg and the energy intensity of 80-100 MJ/cm², by which a part of the dry film photoresist layer was cured. After the exposure process was performed, a wet development process was performed, during which the developer was sprayed on the dry film photoresist layer to remove the uncured dry film photoresist layer and form a patterned photoresist layer with a specific pattern. The developing conditions were as follows: temperature: 29° C., solution: 1.0 wt % $Na_2CO_3$ and spraying pressure: 1.2 kg/cm².

Then, the aforementioned sample was etched by an etching solution prepared with 36 wt % hydrochloric acid aqueous solution+40 wt % ferric chloride aqueous solution+ultrapure water in a volume ratio of 1:1:1, so as to transfer the pattern defined by the patterned photoresist layer into the electrodeposited copper foil to obtain a patterned electrodeposited copper foil. Subsequently, 5 wt % sodium hydroxide aqueous solution was used to remove the cured patterned photoresist layer. Then, the patterned copper-clad laminate was further washed and dried.

After obtaining the aforementioned patterned copper-clad laminate, a micro-etching was performed on a circuit pattern to remove the surface treatment layer on the exposed surface of the circuit pattern. The micro-etching conditions were as follows: solution: 10 vol % $H_2SO_4$ and 90 vol % $H_2O_2$, temperature: 45° C. and processing time: 90 seconds. Thereafter, the copper-clad laminate was washed with water for 30 seconds. Then, the copper-clad laminate with the circuit pattern was immersed in a predetermined reagent for a pretreatment. The pretreatment conditions were as follows:

Reagent: 60 ppm of Omnibond 9249
Temperature: 25° C.
Processing time: 50 seconds.

Subsequently, the copper-clad laminate with the circuit pattern was immersed in a predetermined treatment solution for a blackening treatment. The blackening treatment conditions were as follows:

Treatment solution: 133 ppm of reagent (Omnibond 9249) and 285 ppm of reagent (Omnibond 9251)
Liquid temperature of the treatment solution: 70° C.
Processing time: 330 seconds Thereafter, a copper-clad laminate with blackened circuit patterns was obtained by sequentially washing the copper-clad laminate with water at the room temperature (30 seconds), at a high temperature (pure water at 70° C. for 30 seconds), and drying the copper-clad laminate in air.

The blackened degree of the circuit pattern may be judged, and the judgement results are shown in TABLE 3. The criteria for the judgement are as follows:

A (representing the best blackened degree): uniform color, and the copper is not exposed from the surface of the circuit pattern B (representing ordinary blackened degree): slight color variation, but the copper is not exposed from the surface of the circuit pattern C (representing the worst blackened degree): the copper is exposed from the surface of the circuit pattern <Nickel Content at Surface>

The electrodeposited copper foil was cut to a size of 100×100 mm (i.e., an area of 1 dm²), and the side of the electrodeposited copper foil which was not provided with a nickel-containing layer was covered by a protective layer, where the composition of the protective layer is nylon. Afterwards, the sample was put into a Petri dish and soaked into a solution consisting of 20 ml of 18% HCl solution and 2 ml of 30% $H_2O_2$ solution at room temperature (25° C.) for 10 minutes, and then poured the obtained solution into a 50 ml volumetric flask. Then, the Petri dish was washed by water, which was then collected in a quantitative bottle, and thereby the solution in the quantitative bottle reaches the preset volume of 50 ml. The nickel content was measured by inductively coupled plasma atomic emission spectroscopy (ICP-AES, iCAP7000, purchased from Thermo Company). The carrier gas was argon, and the gas flow rate through the atomizer was 0.5 L/min. The test results are shown in TABLE 3.

<Specific Surface Area>

The surface texture analysis conducted by a laser microscope (LEXT OLS5000-SAF, Olympus) was used to measure the specific surface area ($\mu m^2/\mu m^2$) of the side of the electrodeposited copper foil having the roughening layer. The test results are shown in TABLE 3. Specific measurement conditions are as follows:

Wavelength of light source: 405 nm
Objective lens magnification: 100× objective lens (MPLAPON-100× LEXT, manufactured by Olympus)
Optical zoom: 1.0×
Image area: 129 μm×129 μm
Resolution: 1024 pixels×1024 pixels
Mode: the Auto tilt removal
Filter: unfiltered
Ambient temperature: 25° C.
Relative humidity: 60%

<Reliability>

Six commercially available resin sheets (S7439G, manufactured by SyTech Corp.), each with a thickness of 0.076 mm, were stacked together to form a resin sheet stacked layer, and the electrodeposited copper foil of any of the aforementioned examples was disposed on the resin sheet stacked layer. Then, the electrodeposited copper foil was laminated to the resin sheet stacked layer to form a laminated board. The laminating conditions were as follows: temperature: 200° C., pressure: 400 psi, and pressing time: 120 minutes. The laminated board was cut into 10 cm×10 cm.

Afterwards, a pressure cooker test (PCT) was conducted, and the conditions in the oven were set as follows: temperature: 121° C., pressure: 2 atm, and humidity: 100% RH. The laminated board was placed in the oven for 30 minutes, and then taken out and cooled to room temperature. Then, a solder bath test was performed during which the laminated board treated by the pressure cooker test was soaked in a molten solder bath at a temperature of 288° C. for 10 seconds.

The solder bath test may be repeatedly performed on the same sample, and after each solder bath test, observe whether the laminated board has blister, crack, delamination and other abnormal phenomena. If any of the above abnormal phenomena occurs, it is judged that the laminated board failed the corresponding solder bath test. The test results are shown in TABLE 2. The criteria for the judgement are as follows:

O: The laminated board does not show any abnormal phenomenon after more than 10 solder bath tests X: The laminated board shows abnormal phenomena after less than 10 solder bath tests <Signal Transmission Loss>

Figure 3:
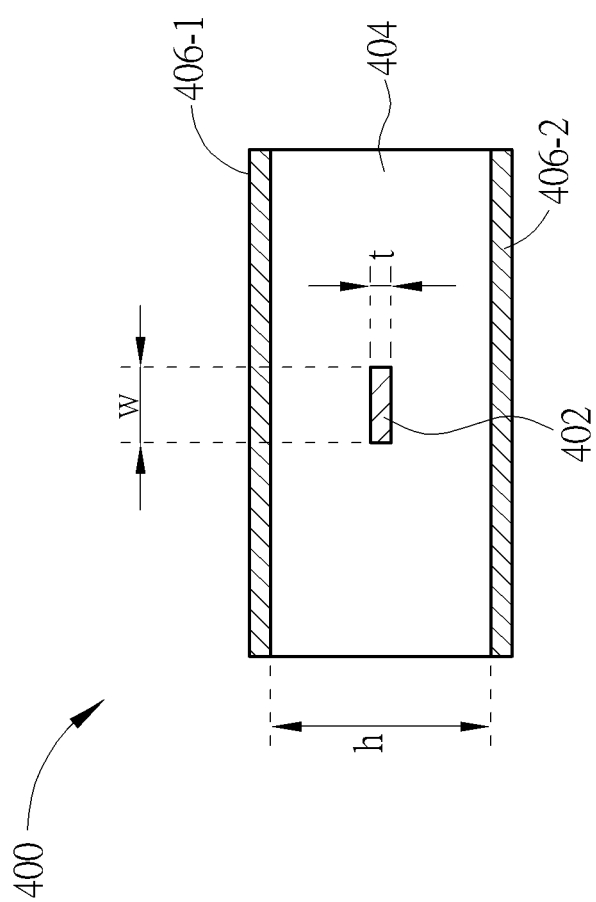
FIG. 3 is a schematic diagram of a strip-line according to one embodiment of the present disclosure.

The surface-treated copper foil of any of the aforementioned embodiments was made into a strip-line as shown in FIG. 3, and the corresponding signal transmission loss was measured. Specifically, for a strip-line 400, the surface-treated copper foil of any of the aforementioned embodiments is attached to the resin (S7439G, manufactured by Shengyi Technology Co.) with a thickness of 152.4 μm, subsequently the surface-treated copper foil is made into a conductive line 402, and then two other pieces of resin (S7439G, manufactured by Shengyi Technology Co.) were used to cover the two side surfaces respectively, so that the conductive line 402 is disposed in a dielectric body (S7439G, manufactured by Shengyi Technology Co.) 404. The strip-line 400 may further include two grounded electrodes 406-1 and 406-2 disposed on opposite sides of the dielectric body 404, respectively. The grounded electrode 406-1 and the grounded electrode 406-2 may be electrically connected to each other through the conductive via hole, so that the grounded electrode 406-1 and the grounded electrode 406-2 have equal potential. The specifications of each component in the strip-line 400 are as follows:

The length of the conductive line 402: 100 mm
The width w: 120 m
The thickness t: 35 m
The dielectric characteristic of the dielectric body 404: Dk=3.74 and Df=0.006 (measured at 10 GHz signal according to IPC-TM 650 No. 2.5.5.5)
The characteristic impedance: 50Ω.
State: without covering film For the measurement of the signal transmission loss, which is measured according to the standard Cisco S3 method, the signal analyzer is used to input the electrical signal from one end of the conductive line 402 when the grounded electrodes 406-1 and 406-2 are both at the ground potential, and measure the output value at the other end of the conductive line 402 to determine the signal transmission loss caused by the strip-line 400. Specific measurement conditions are as follows:

Signal analyzer: PNA N5227B (Keysight Technologies)
Frequency of electrical signal: 10 MHz to 20 GHz
Sweeping points: 2000 points
Calibration mode: E-Cal (cal kit: N4692D)

The degree of signal transmission loss of the corresponding strip-line is judged under the condition that the frequency of the electrical signal is set at 16 GHz. In particular, when the absolute value of signal transmission loss is smaller, it means that the degree of signal loss is less. The criteria for the judgement are as follows:

A (the signal transmission performance is best): the absolute value of signal transmission loss is less than 1.15 dB/in B (the signal transmission performance is good): the absolute value of signal transmission loss is in a range of 1.15 to 1.25 dB/in C (the signal transmission performance is worst): the absolute value of signal transmission loss is larger than 1.25 dB/in

TABLE 2

| | TGA | | |
|---|---|---|---|
| | $T_{onset}$ (° C.) | $T_{105.0}$ wt % (° C.) | Blackened degree |
| Ex. 1 | 432 | 610 | B |
| Ex. 2 | 520 | 688 | B |
| Ex. 3 | 568 | 740 | A |
| Ex. 4 | 432 | 595 | B |
| Ex. 5 | 430 | 597 | B |
| Ex. 6 | 504 | 670 | B |
| Ex. 7 | 551 | 728 | A |
| Ex. 8 | 546 | 726 | A |
| Ex. 9 | 548 | 725 | A |
| Ex. 10 | 547 | 726 | A |
| Ex. 11 | 428 | 596 | B |
| Ex. 12 | 501 | 668 | B |
| Ex. 13 | 425 | 609 | B |
| c.f. 1 | 356 | 508 | C |
| c.f. 2 | 367 | 514 | C |
| c.f. 3 | 383 | 531 | C |

According to the examples shown in TABLE 2, when the primary temperature ($T_{105.0\ wt\ \%}$) of the electrodeposited copper foil obtained by performing the thermogravimetric analysis is in a range of 550° C. to 750° C., the blackened degrees of the corresponding conductive lines of the electrodeposited copper foil of Examples 1-13 all achieve class A or class B and without any class C, compared with Comparative Examples 1-3 where the primary temperature ($T_{105.0\ wt\ \%}$) obtained by performing the thermogravimetric analysis is within other ranges. That is, the blackened degree of the corresponding conductive lines of the electrodeposited copper foils of Examples 1-13 may be relatively uniform.

Furthermore, when the primary temperature ($T_{105.0\ wt\ \%}$) of the electrodeposited copper foil obtained by performing the thermogravimetric analysis is in a range of 600° C. to 750° C., such as those corresponding to Examples 3, 7-10, the blackened degrees of the corresponding conductive lines all achieve class A, which means that the blackened degree of the corresponding conductive lines is more uniform.

When the onset temperature ($T_{onset}$) of the electrodeposited copper foil obtained by performing the thermogravimetric analysis is in a range of 400° C. to 600° C., the blackened degrees of the corresponding conductive lines of the electrodeposited copper foil of Examples 1-13 all achieve class A or class B and without any class C, compared with Comparative Examples 1-3 where the onset temperature ($T_{onset}$) obtained by performing the thermogravimetric analysis is within other ranges. That is, the blackened degree of the corresponding conductive lines of the electrodeposited copper foils of Examples 1-13 may be relatively uniform.

TABLE 3

| | Nickel content at surface (A) (μg/dm²) | Specific surface area (B) (my/my) | A*B (μg/dm²) | TGA $T_{100.1wt\%}$ (° C.) | Reliability | Signal transmission loss |
|---|---|---|---|---|---|---|
| Ex. 1 | 22 | 1.2 | 26.4 | 311 | O | A |
| Ex. 2 | 23 | 1.7 | 39.1 | 302 | O | A |
| Ex. 3 | 51 | 1.2 | 61.2 | 338 | O | B |
| Ex. 4 | 53 | 1.1 | 90.1 | 322 | O | B |
| Ex. 6 | 78 | 1.1 | 85.8 | 394 | O | B |
| Ex. 7 | 22 | 1.7 | 37.4 | 306 | O | A |
| Ex. 8 | 50 | 1.8 | 90.0 | 323 | O | B |
| Ex. 9 | 90 | 1.7 | 153.0 | 346 | O | C |
| Ex. 10 | 93 | 1.8 | 167.4 | 347 | O | C |
| Ex. 11 | 52 | 2.5 | 130.0 | 310 | O | C |
| Ex. 12 | 10 | 1.1 | 11.0 | 250 | X | A |
| Ex. 13 | 22 | 2 | 44.0 | 257 | X | A |
| c.f. 1 | 22 | 1.2 | 26.4 | 312 | O | A |
| c.f. 2 | 23 | 2.3 | 52.9 | 223 | X | A |
| c.f. 3 | 110 | 2.1 | 231.0 | 340 | O | C |

According to TABLE 3, when the product of the nickel content at the surface of the electrodeposited copper foil and the specific surface area of the electrodeposited copper foil is less than 100 μg/dm², for example, in a range of 10 μg/dm² to 100 μg/dm², the signal transmission losses of the strip-lines in the corresponding Examples (i.e., Examples 1-4, 6-8, 12-13) all achieve class A or class B and without any class C, which means the signal transmission losses are more slight.

When the product of the nickel content at the surface of the electrodeposited copper foil and the specific surface area of the electrodeposited copper foil is in a range of 10 μg/dm² to 60 μg/dm², the signal transmission losses of the strip-lines in the corresponding Examples (i.e., Examples 1-2, 7, 12-13) all achieve class A and without any class B or class C, which means the signal transmission losses are more slight.

Furthermore, when the secondary temperature ($T_{101.1\ wt\ \%}$) of the electrodeposited copper foil obtained by performing the thermogravimetric analysis is in a range of 300° C. to 400° C., the laminated boards for the corresponding examples (i.e., Examples 1-11) may further pass the reliability test without showing any blister, crack, delamination or other abnormal phenomenon, compared with those of Examples 12 and 13 and Comparative Examples 1-3 where the secondary temperature ($T_{101.0\ wt\ \%}$) obtained by performing the thermogravimetric analysis is within other ranges.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrodeposited copper foil, comprising a bulk copper foil, wherein while a weight of the electrodeposited copper foil is increased to 105.0 wt % during a thermogravimetric analysis (TGA) performed on the electrodeposited copper foil at a heating rate of 5° C./min and an air flow rate of 95 mL/min, a heating temperature of the TGA is defined as $T_{105.0\ wt\ \%}$ and in a range of 550° C. to 750° C.

2. The electrodeposited copper foil of claim 1, wherein $T_{105.0\ wt\ \%}$ is in a range of 600° C. to 750° C.

3. The electrodeposited copper foil of claim 1, wherein while the weight of the electrodeposited copper foil is increased to 100.1 wt % during the TGA, the heating temperature of the TGA is defined as $T_{100.1\ wt\ \%}$ and in a range of 300° C. to 400° C.

4. The electrodeposited copper foil of claim 3, wherein $T_{100.1\ wt\ \%}$ is in a range of 330° C. to 400° C.

5. The electrodeposited copper foil of claim 3, wherein the electrodeposited copper foil has a onset temperature ($T_{onset}$) during the TGA, wherein $T_{onset}$ is greater than $T_{100.1\ wt\ \%}$, and $T_{onset}$ is smaller than $T_{105.0\ wt\ \%}$.

6. The electrodeposited copper foil of claim 5, wherein $T_{onset}$ is in a range of 400° C. to 600° C.

7. The electrodeposited copper foil of claim 1, wherein the electrodeposited copper foil has an inflection temperature ($T_{IF}$) during the TGA, wherein $T_{IF}$ is in a range of 750° C. to 1000° C.

8. The electrodeposited copper foil of claim 1, further comprising a first surface treatment layer comprising nickel, wherein the product of a specific surface area (μm²/μm²) of the outer surface of the first surface treatment layer and a nickel content (μg/dm²) of the first surface treatment layer is in a range of 10 μg/dm² to 100 μg/dm².

9. The electrodeposited copper foil of claim 8, wherein the product of the specific surface area (μm²/μm²) of the outer surface of the first surface treatment layer and the nickel content (μg/dm²) of the first surface treatment layer is in a range of 10 μg/dm² to 60 μg/dm².

10. The electrodeposited copper foil of claim 1, further comprising a first surface treatment layer and a second surface treatment layer, wherein the first surface treatment layer is disposed on a first side of the electrodeposited copper foil, and the second surface treatment layer is disposed on a second side of the electrodeposited copper foil opposite to the first side of the electrodeposited copper foil, wherein the first surface treatment layer and the second surface treatment layer each comprises at least one sub-layer respectively, and the at least one sub-layer is selected from the group consisting of a barrier layer and a antirust layer.

11. The electrodeposited copper foil of claim 10, wherein the barrier layer comprises at least one metal, and the metal is selected from the group consisting of nickel, zinc, chromium, cobalt, molybdenum, iron, tin, vanadium, tungsten and titanium.

12. The electrodeposited copper foil of claim 10, wherein the first surface treatment layer further comprises at least one another sub-layer, and the at least one another sub-layer is selected from the group consisting of a roughening layer and a coupling layer.

13. A copper-clad laminate, comprising:
a board; and
the electrodeposited copper foil of claim 1, wherein the electrodeposited copper foil is disposed on the board.

\* \* \* \* \*